United States Patent
Lin et al.

(10) Patent No.: US 7,202,162 B2
(45) Date of Patent: Apr. 10, 2007

(54) ATOMIC LAYER DEPOSITION TANTALUM NITRIDE LAYER TO IMPROVE ADHESION BETWEEN A COPPER STRUCTURE AND OVERLYING MATERIALS

(75) Inventors: Jing-Cheng Lin, Hsinchu Country (TW); Chao-Hsien Peng, Hsinchu (TW); Shau Lin Shue, Hsinchu (TW); Mong Song Liang, Hsin-chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 113 days.

(21) Appl. No.: 10/420,311

(22) Filed: Apr. 22, 2003

(65) Prior Publication Data

US 2004/0214425 A1    Oct. 28, 2004

(51) Int. Cl.
*H01L 21/4763* (2006.01)
(52) U.S. Cl. .................. 438/637; 438/685; 438/687
(58) Field of Classification Search ........ 438/637–640, 438/687, 685, 680
See application file for complete search history.

(56) References Cited

U.S. PATENT DOCUMENTS

| 6,004,188 | A | 12/1999 | Roy ........................... 451/41 |
| 6,083,822 | A | 7/2000 | Lee ........................... 438/624 |
| 6,090,696 | A | 7/2000 | Jang et al. ................ 438/617 |
| 6,093,632 | A | 7/2000 | Lin ............................ 438/618 |
| 6,197,688 | B1* | 3/2001 | Simpson .................... 438/678 |
| 6,365,527 | B1* | 4/2002 | Yang et al. ................ 438/761 |
| 6,391,780 | B1 | 5/2002 | Shih et al. ................. 438/692 |
| 6,403,459 | B1 | 6/2002 | Ohashi et al. ............. 438/618 |
| 2003/0057526 | A1* | 3/2003 | Chung et al. | |
| 2003/0134495 | A1* | 7/2003 | Gates et al. | |

* cited by examiner

*Primary Examiner*—Alexander Ghyka
(74) *Attorney, Agent, or Firm*—Haynes & Boone, LLP

(57) ABSTRACT

A process for improving the adhesion between an underlying copper structure, and overlying materials and structures, has been developed. The process features formation of a tantalum nitride layer on a copper structure, wherein the copper structure is located in a damascene type opening. To obtain the maximum adhesion benefit the tantalum nitride layer is formed via an atomic deposition layer procedure, performed at specific deposition conditions. The adhesion between the underlying copper structure and overlying materials such as a silicon nitride etch stop layer, as well the adhesion between the lower level copper structure and overlying upper level metal interconnect structures, is improved as a result of the presence of the atomic layer deposited tantalum nitride layer.

24 Claims, 3 Drawing Sheets

ATOMIC LAYER DEPOSITION TANTALUM NITRIDE LAYER TO IMPROVE ADHESION BETWEEN A COPPER STRUCTURE AND OVERLYING MATERIALS

BACKGROUND OF THE INVENTION (1) Field of the Invention

The present invention relates to processes used to fabricate semiconductor devices, and more specifically to a method of forming a capping layer on a copper structure, wherein the capping layer improves the adhesion between the copper structure and overlying materials.

(2) Description of Prior Art

Micro-miniaturization, or the ability to fabricate semiconductor devices with sub-micron features, has allowed the performance of the sub-micron devices to be increased. The use of smaller device features have resulted in a reduction of performance degrading parasitic junction capacitances enabling the desired device performance increase to be realized. In addition the use of low dielectric constant materials, as well as the use of more conductive interconnect materials such as copper, have also contributed to device performance enhancements. However the use of the above materials such as copper for interconnect structures, has brought attention to specific process and structural concerns which were not as crucial with other interconnect structures, structures fabricated with materials such as aluminum. For example the adhesion between a copper damascene structure and overlying layers or structures, such as a silicon nitride etch stop layer, or an overlying upper level conductive interconnect structure, can be marginal possibly resulting in yield loss or reliability degradation. The thickness of materials overlying the copper damascene structure have to be carefully chosen as well as carefully prepared or formed, to reduce the risk of adhesion loss to the underlying copper structure.

This invention will describe a novel process sequence for improving the adhesion between a copper structure and overlying materials via the use of a capping layer formed on the copper structure, wherein the capping layer is obtained using a specific mode of deposition as well as using specific deposition conditions. Prior art, such as Shih et al, in U.S. Pat. No. 6,391,780 B1, Roy in U.S. Pat. No. 6,004,188, and Ohashi et al in U.S. Pat. No. 6,403,459 B1, describe methods of forming copper structures, methods of forming damascene structures, and methods of improving adhesion between copper structures and adjacent materials. These prior art however do not describe the novelty of this present invention in which a specific capping layer material, deposited via a specific deposition mode using specific deposition conditions, is employed to improve the adhesion between a copper damascene structure and overlying layers and structures.

SUMMARY OF THE INVENTION

It is an object of this invention to form a capping layer on an underlying copper structure to improve the adhesion between the copper structure and overlying layers and structures.

It is another object of this invention to use a tantalum nitride (TaN), layer, deposited to a specific thickness and using specific conditions that will result in a tantalum nitride layer featuring improved adhesive characteristics, as well providing insulator characteristics.

It is still another object of this invention to use an atomic layer deposition (ALD), procedure for deposition of the TaN layer.

In accordance with the present invention a method of improving the adhesion of a copper damascene structure to overlying layers and structures, featuring the use of a ALD TaN capping layer formed on the underlying copper damascene structure, is described. After definition of a damascene or dual damascene type opening in a dielectric layer such as a low dielectric (low k), layer exposing an underlying lower level interconnect structure, a metal barrier is deposited. After deposition of a copper seed layer, additional copper is deposited completely filling the damascene type opening. Removal of copper and metal barrier layer from the top surface of the low k layer results in the definition of a copper damascene structure in the damascene type opening. A thin TaN layer is next deposited via specific ALD conditions, resulting in a TaN capping layer, featuring excellent adhesive properties, on the surface of the copper damascene structure as well as on the surface of the low k layer. An etch stop layer and an overlying dielectric layer are next formed on the TaN capping layer, followed by patterning procedures used to define an opening in the overlying dielectric layer, in the etch stop layer, and in the TaN capping layer, exposing a portion of the top surface of the copper damascene structure. An overlying, upper level interconnect structure is next formed in the opening, overlying and contacting the copper damascene structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
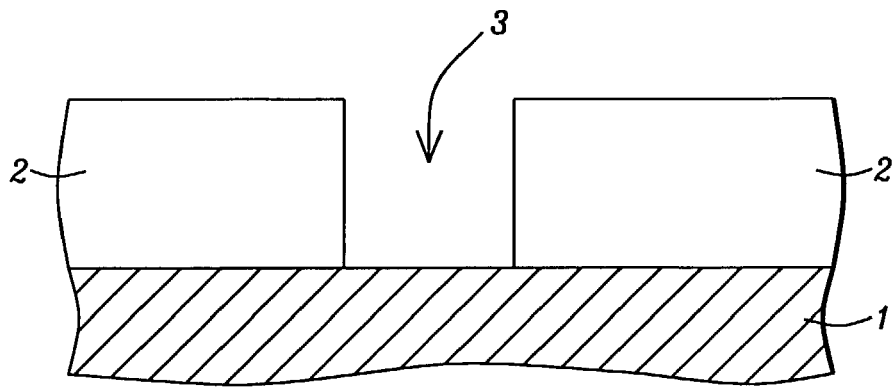
FIGS. 1–7, which schematically in cross-sectional style, describe key stages for the fabrication of a copper damascene structure featuring an overlying TaN capping layer formed via ALD procedures, and used to improve the adhesion between the copper damascene structure and overlying layers such as etch stop and interlevel dielectric layers.

The method of forming a copper damascene structure featuring an overlying TaN capping layer, formed via ALD procedures and used to improve the adhesion between the copper damascene structure and overlying layers such as etch stop and interlevel dielectric layers, will now be described in detail. Conductive region 1, shown schematically in FIG. 1, can be an underlying, lower level metal interconnect structure, or a underlying metal via structure, comprised of either aluminum based material, copper, or tungsten. Inter-metal dielectric (IMD), layer 2, comprised of an insulator layer such as silicon oxide, or comprised of a low dielectric (low k), layer such as a fluorinated silica glass (FSG), with a dielectric constant between 3.5 to 3.8, is formed on conductive region 1, at a thickness between about 2000 to 4000 Angstroms, via chemical vapor deposition (CVD), procedures. A photoresist shape, not shown in the drawings, is formed on IMD layer 2, and used as an etch mask to allow definition of opening 3, to be accomplished via an anisotropic reactive ion etching (RIE), procedure using $CHF_3$ as a selective etchant for the material comprised of IMD layer 2. Damascene type opening 3, is formed with a diameter between about 0.05 to 0.3 µm. If desired opening 3, can be a dual damascene type opening, comprised of a top or trench portion, wider in diameter than a bottom or via portion. Either opening exposes a top portion of conductive region 1. This is schematically shown in FIG. 1. The photoresist shape used for definition of opening 3, is removed via plasma oxygen ashing procedures.

Figure 2:
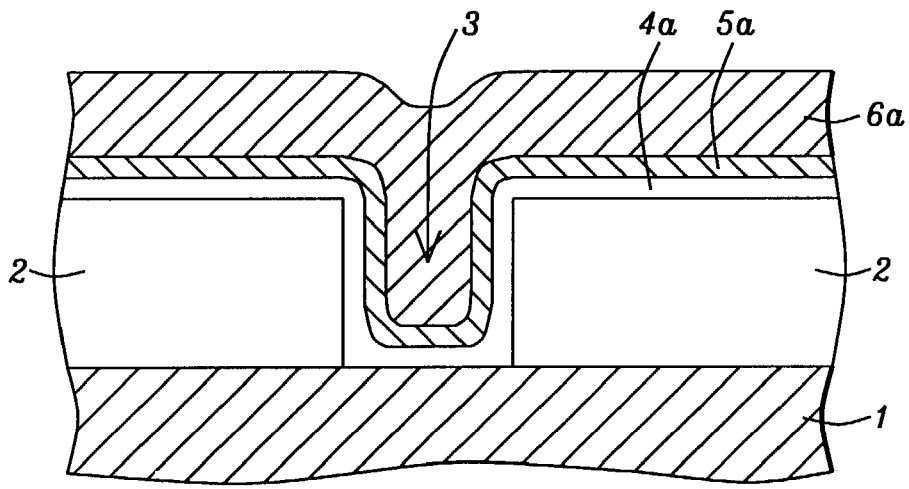

To prevent copper poisoning of IMD layer 2, a metal barrier layer is formed on the exposed surfaces of opening 3, prior to the filling with copper. A metal barrier layer such as titanium nitride is deposited via plasma vapor deposition (PVD), procedures, to a thickness between about 20 to 400 Angstroms. Metal barrier layer 4a, contours the exposed surfaces of opening 3, as well as overlying the portion of top surface of conductive region 1, and the top surface of IMD layer 2. If desired metal barrier layer 4a, can also be comprised of tantalum nitride, or tungsten nitride. Copper seed layer 5a, is next formed on metal barrier layer 4a, via PVD or CVID procedures, at a thickness between about 200 to 2000 Angstroms. Copper seed layer 5a, will provide the needed surface for a subsequent copper plating procedure to be successfully performed. Copper fill layer 6a, is now obtained via electro-chemical deposition (ECD) procedures, to a thickness between about 3,000 to 30,000 Angstroms, completely filling opening 3. An anneal procedure is next performed at a temperature between about 120 to 400° C., for a time between about 0.5 to 30 min., in an inert ambient, to reduce the size and amount of voids in copper fill layer 6a. The result of these procedures is schematically shown in FIG. 2.

Figure 3:
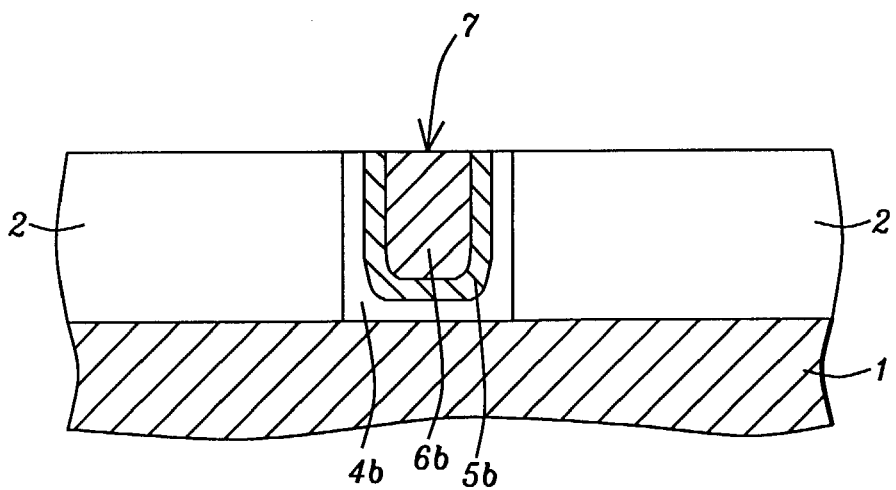

Removal of unwanted materials overlying the top surface of IMD layer 2, is next addressed and schematically described in FIG. 3. A chemical mechanical polishing (CMP), procedure is employed to selectively remove the portions of copper fill layer 6a, the portions of copper seed layer 5a, and the portions of metal barrier layer 4a, located on the top surface of IMD layer 2, resulting in copper damascene structure 7, now comprised with copper fill shape 6b, copper seed layer shape 5b, and metal barrier shape 4b. The CMP procedure selectively terminates at the appearance of the top surface of IMD layer 2.

Figure 4:
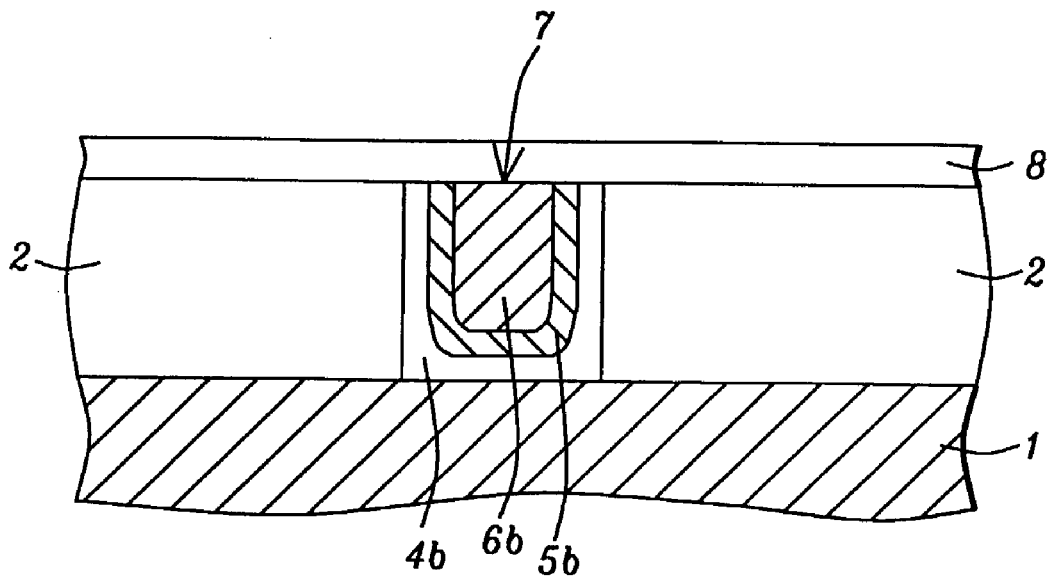

To avoid adhesion loss of materials formed on copper damascene structure 7, such materials as etch stop layers and overlying thick IMD layers, a capping layer which will provide an adhesive bond between copper damascene structure 7, and the subsequent overlying materials, is now formed. A tantalum nitride (TaN), layer is used to provide the desired adhesion improvement material. However to provide the desired adhesive properties, as well as to perform as a resistive or insulating layer, the TaN layer has to be formed using specific deposition conditions. To satisfy the needed adhesion and insulating properties an atomic layer deposition (ALD), procedure is performed at a temperature between about 175 to 350° C., at a pressure between about 50 to 500 torr, using PDMAT or $TaCl_2$, and ammonia as reactants. The ratio of PDMAT or $TaCl_2$ to $NH_3$ is maintained between about 0.1 to 1, to 1 to 1, to obtain a TaN layer which provides the optimum characteristics. The thickness of TaN layer 8, schematically shown in FIG. 4, is between about 10 to 150 Angstroms. The resistivity of TaN layer 8, between about $10^5$ to infinity ohm-cm, will allow the layer to behave as an insulator layer in regions overlying IMD layer 2. The key feature of this invention is the ability to form a TaN cap layer with a N/Ta ratio greater than 1.2, with a preferred ratio of 1.5. The atomic layer deposition mode, using the above conditions and reactants allows this desirable N/Ta ratio to be obtained. Other methods, such as plasma deposited TaN, do not allow the desired N/Ta ratio to be obtained. In addition the use of TaN as a cap layer with the desirable N/Ta ratio successfully replaces the less effective capping layers comprised with either SiC or SiN.

Figure 5:
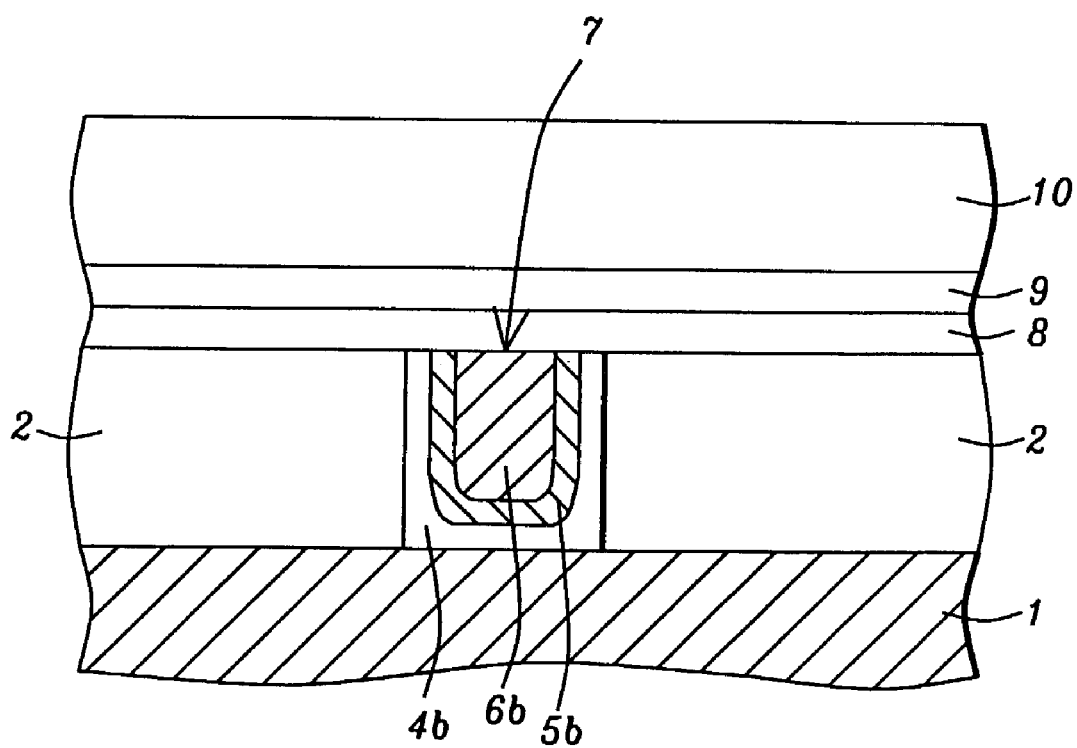

Insulator layer 9, a layer such as silicon nitride or silicon carbide, is next deposited on TaN layer 8, via plasma enhanced chemical vapor deposition (PECVD), or low pressure chemical vapor deposition (LPCVD), procedures, at a thickness between about 300 to 500 Angstroms. Insulator layer 9, will be used as an etch stop layer during a dry etch procedure used to define an opening in an upper level IMD layer, to expose the top surface of copper damascene structure 7. However the high compressive stress of etch stop insulator layer 9, if deposited directly on copper damascene structure 7, and IMD layer 2, could result in peeling of the etch stop layer from underlying materials resulting in inadequate passivation of copper damascene structure 7, possibly leading to yield loss or reliability failure. The presence of TaN layer 8, formed with superior adhesion characteristics however prevents the peeling or adhesion loss phenomena from occurring. The deposition of etch stop insulator layer 9, is followed by the deposition of IMD layer 10. IMD layer 10, deposited to a thickness between about 2000 to 4000 Angstroms via CVD procedures, is again comprised of a low k layer such as a FSG layer featuring a dielectric constant between about 3.5 to 3.9. The result of these depositions is schematically shown in FIG. 5.

Figure 6:
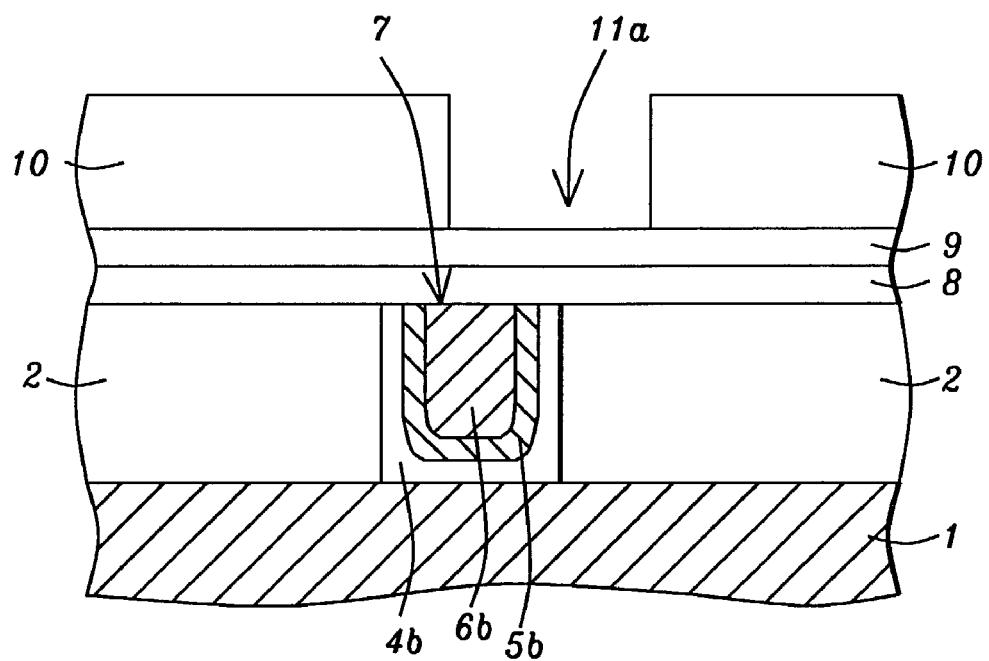

A photoresist shape, not shown in the drawings, is now used as an etch mask to allow an anisotropic RIE procedure to define opening 11a, in IMD layer 10. The RIE procedure is accomplished using $CHF_3$ as a selective etchant for IMD layer 11a, with the dry etch procedure terminating at the appearance of etch stop, insulator layer 9. This is schematically shown in FIG. 6.

Figure 7:
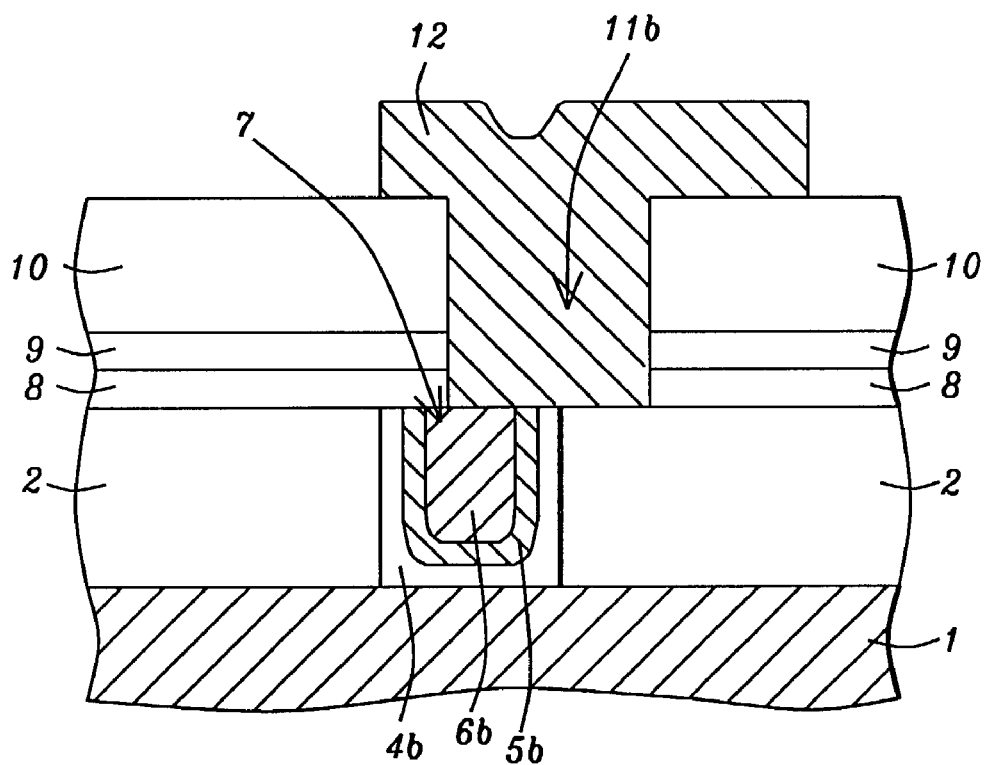

The photoresist shape used for definition of opening 11a, can remain in place or removed if desired via plasma oxygen ashing procedures, prior to continuation of the anisotropic RIE procedure, performed using $CF_4$ or $Cl_2$ as an etchant for etch stop insulator layer, extending opening 11a, into etch stop insulator layer 9. The anisotropic RIE procedure concludes with removal of the portion of TaN layer 8, exposed in opening 11a, resulting in final opening 11b, shown schematically in FIG. 7, exposing a portion of the top surface of copper damascene structure 7. This is accomplished using argon sputtering as an etchant for TaN layer 8. The remaining portions of TaN layer 8, located on portions of the top surface of IMD layer 2, as well as on portions of the top surface of copper damascene structure 7, features insulator characteristics as a result of the thickness and deposition conditions used, and therefore do not present leakage problems. If desired final opening 11b, can be defined as a dual damascene type opening, or can be defined exposing the entire top surface of copper damascene structure 7. Upper level metal interconnect structure 12, is next formed, with a portion of this structure located in final opening 11b, overlying and contacting the portion of top surface of copper damascene structure 7. This is schematically illustrated in FIG. 7. Upper level metal interconnect structure 12, can be comprised of a material such as aluminum based material, copper, or tungsten. Upper level metal structure 12, as shown in FIG. 7, is illustrated as a structure defined via metal deposition and photolithographic and etching procedures. However if desired upper level metal interconnect structure 12, can be defined as a damascene structure, obtained via metal deposition followed by removal of portions of metal from the top surface of IMD layer 10. Of greatest importance however is the improved adhesion between copper damascene structure 7, and overlying materials and structures, as a result of the presence of TaN layer 8, formed using a specific thickness range and via specific deposition conditions, both allowing enhanced adhesive properties of TaN layer 8, to be obtained.

While this invention has been particularly shown and described with reference to the preferred embodiments thereof, it will be understood by those skilled in the art that various changes in form and details may be made without departing from the spirit or scope of the invention.

What is claimed is:

1. A method of forming metal interconnect network featuring a capping layer formed on an underlying lower level metal structure, comprising the steps of:

providing an underlying conductive region;

forming a first opening in a first dielectric layer disposed on said underlying conductive region exposing a portion of a top surface of said underlying conductive region;

forming a lower level metal structure in said first opening;

forming a capping layer on said lower level metal structure and directly on a top surface of said first dielectric layer;

forming a etch stop layer on said capping layer;

forming a second dielectric layer on said etch stop layer;

forming a second opening in said second dielectric layer, in said etch stop layer, and in said capping layer, exposing a portion of a top surface of said lower level metal structure; and forming an upper level metal structure in said second opening.

2. The method of claim 1, wherein said conductive region is a metal via structure, comprised of either an aluminum based material, copper, or tungsten.

3. The method of claim 1, wherein said first dielectric layer is a low dielectric (low k) layer comprising a fluorinated silica glass (FSG) with a dielectric constant between 3.5 to 3.8 formed at a thickness between about 2000 to 4000 Angstroms via chemical vapor deposition procedures.

4. The method of claim 1, wherein said first dielectric layer is a silicon oxide layer, obtained via LPCVD or PECVD procedures at a thickness between about 2000 to 4000 Angstroms.

5. The method of claim 1, wherein said first opening is a damascene type opening, comprised with a diameter between about 0.05 to 0.3 um.

6. The method of claim 1, wherein said first opening is a dual damascene type opening.

7. The method of claim 1, wherein said lower level metal structure is comprised of copper, formed in said first opening via electro-chemical deposition procedures.

8. The method of claim 1, wherein said capping layer is a tantalum nitride layer, obtained via atomic layer deposition.

9. The method of claim 8, wherein said tantalum nitride layer is obtained at a thickness between about 10 to 150 Angstroms, and with a N/Ta ratio greater than 1.2, with a preferred ratio of 1.5.

10. The method of claim 1, wherein said capping layer is obtained via ALD procedures, performed at a temperature between about 175 to 350° C., at a pressure between about 50 to 500 torr, using a ratio of PDMAT or $TaCl_2$ to ammonia between about 0.1 to 1, to 1 to 1.

11. The method of claim 1, wherein said etch stop layer is a silicon nitride layer, obtained via LPCVD or PECVD procedures to a thickness between about 300 to 500 Angstroms.

12. The method of claim 1, wherein said etch stop layer is a silicon carbide layer, obtained at a thickness between about 300 to 500 Angstroms.

13. The method of claim 1, wherein said second dielectric layer is a low dielectric (low k) layer comprising a fluorinated silica glass (FSG) with a dielectric constant between 3.5 to 3.8 formed at a thickness between about 2000 to 4000 Angstroms via chemical vapor deposition procedures.

14. The method of claim 1, wherein said second dielectric layer is a silicon oxide layer, obtained via LPCVD or PECVD procedures at a thickness between about 2000 to 4000 Angstroms.

15. A method of fabricating a metal interconnect network, comprising the steps of:

providing an underlying conductive region;

forming a first low dielectric layer;

forming a first opening in said first low dielectric layer exposing a portion of a top surface of said conductive region;

forming a lower level copper structure, completely filling said first opening;

performing an atomic layer deposition (ALD) procedure to form a TaN layer on a top surface of said lower level copper structure and directly on a top surface of said first low dielectric layer;

forming an etch stop layer on said TaN layer;

forming a second low dielectric layer on said etch stop layer;

forming a second opening in said second low dielectric layer, in said etch stop layer, and in said TaN layer, exposing a portion of a top surface of said lower level copper structure; and forming an upper level metal structure in said second opening.

16. The method of claim 15, wherein said first low dielectric layer is fluorinated silica glass (FSG), layer, comprised with a dielectric constant between 3.5 to 3.8, and formed at a thickness between about 2000 to 4000 Angstroms, via chemical vapor deposition procedures.

17. The method of claim 15, wherein said first opening is a damascene type opening, comprised with a diameter between about 0.05 to 0.3 um.

18. The method of claim 15, wherein said first opening is a dual damascene type opening.

19. The method of claim 15, wherein said lower level copper structure is obtained via electrochemical deposition procedures to a thickness between about 3,000 to 30,000 Angstroms.

20. The method of claim 15, wherein said TaN layer is formed at a thickness between about 10 to 150 Angstroms, with a N/Ta ratio greater than 1.2, with a preferred ratio of 1.5.

21. The method of claim 15, wherein the said ALD procedure is performed at a temperature between about 175 to 350° C., at a pressure between about 50 to 500 torr, using a ratio of PDMAT to $TaCl_2$ to ammonia between about 0.1 to 1, to 1 to 1.

22. The method of claim 15, wherein said etch stop layer is a silicon nitride layer, obtained via LPCVD or PECVD procedures to a thickness between about 300 to 500 Angstroms.

23. The method of claim 15, wherein said etch stop layer is a silicon carbide layer, obtained at a thickness between about 300 to 500 Angstroms.

24. The method of claim 15, wherein said second low dielectric layer is a fluorinated silica glass (FSG), with a dielectric constant between 3.5 to 3.8, formed at a thickness between about 2000 to 4000 Angstroms, via chemical vapor deposition procedures.

* * * * *